(12) United States Patent
Kim

(10) Patent No.: US 7,847,311 B2
(45) Date of Patent: Dec. 7, 2010

(54) ORGANIC LIGHT EMITTING DISPLAY (OLED) WITH CONDUCTIVE SPACER AND ITS METHOD OF MANUFACTURE

(75) Inventor: Eun Ah Kim, Suwon-si (KR)

(73) Assignee: Samsung Mobile Display Co., Ltd., Giheung-Gu, Yongin, Gyunggi-Do (KR)

( * ) Notice: Subject to any disclaimer, the term of this patent is extended or adjusted under 35 U.S.C. 154(b) by 664 days.

(21) Appl. No.: 11/522,325

(22) Filed: Sep. 18, 2006

(65) Prior Publication Data
US 2007/0075329 A1  Apr. 5, 2007

(30) Foreign Application Priority Data
Sep. 30, 2005  (KR) ................ 10-2005-0092312

(51) Int. Cl.
*H01L 29/267* (2006.01)
(52) U.S. Cl. ............................ 257/99; 257/E23.175
(58) Field of Classification Search .......... 257/98–100, 257/E23.175
See application file for complete search history.

(56) References Cited

U.S. PATENT DOCUMENTS

| | | | | |
|---|---|---|---|---|
| 5,508,228 A | * | 4/1996 | Nolan et al. | 438/614 |
| 5,583,350 A | * | 12/1996 | Norman et al. | 257/88 |
| 5,783,465 A | * | 7/1998 | Canning et al. | 438/119 |
| 5,998,875 A | * | 12/1999 | Bodo et al. | 257/778 |
| 6,100,103 A | * | 8/2000 | Shim et al. | 438/26 |

FOREIGN PATENT DOCUMENTS

| | | |
|---|---|---|
| JP | 62-278534 | 12/1987 |
| JP | 02-096119 | 4/1990 |
| JP | 05-142548 | 6/1993 |
| JP | 07-140481 | 6/1995 |
| JP | 08-179348 | 7/1996 |
| JP | 11-002820 | 1/1999 |
| JP | 11-133454 | 5/1999 |
| JP | 2000-199915 | 7/2000 |
| JP | 2002-244589 | 8/2002 |
| JP | 2004-253303 | 9/2004 |
| JP | 2004-272272 | 9/2004 |
| KR | 20-0222471 | 2/2001 |
| KR | 10-2004-0080729 | 9/2004 |

OTHER PUBLICATIONS

*Office action* from the Korean Intellectual Property Office issued in Applicant's corresponding Korean Patent Application No. 10-2005-0092312 dated Sep. 26, 2006.
Office action from Japanese Patent Office issued in Applicant's corresponding Japanese Patent Application No. 2006-251487 date Apr. 7, 2009 and Request for Entry of the Accompanying Office Action.

* cited by examiner

*Primary Examiner*—David A Zarneke
*Assistant Examiner*—Jenny L Wagner
(74) *Attorney, Agent, or Firm*—Robert E. Bushnell, Esq.

(57) ABSTRACT

An Organic Light Emitting Display (OLED) includes: a lower substrate having at least one thin film transistor arranged thereon in a active region and a power supply lower stripe arranged thereon in a non-emissive region; an upper substrate corresponding to the lower substrate and having a power supply upper stripe arranged thereon in the non-emissive region; and a conductive spacer arranged between the upper stripe and the lower stripe in the non-emissive region to electrically connect the upper stripe to the lower stripe.

14 Claims, 5 Drawing Sheets

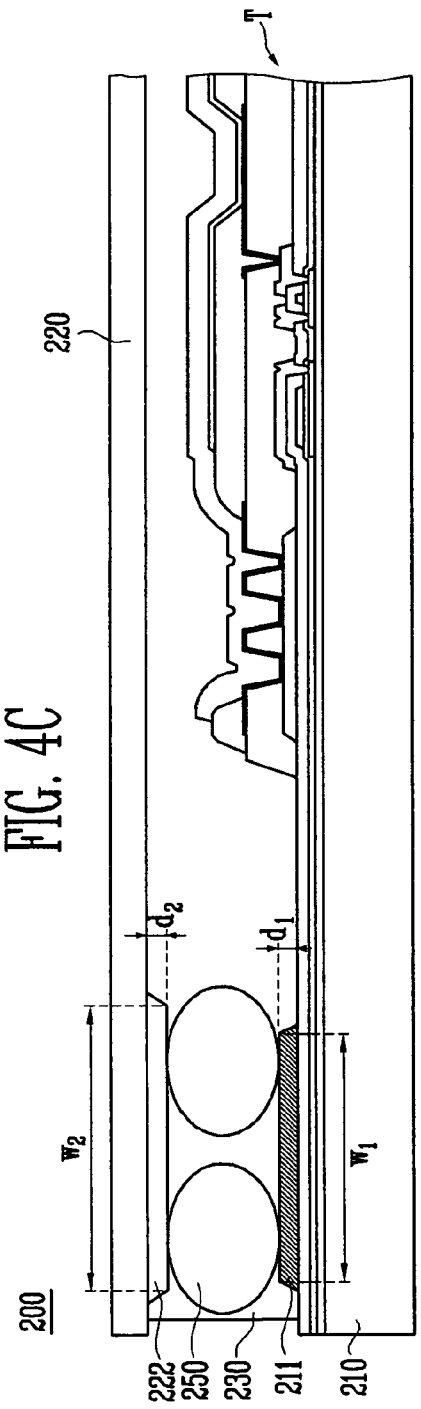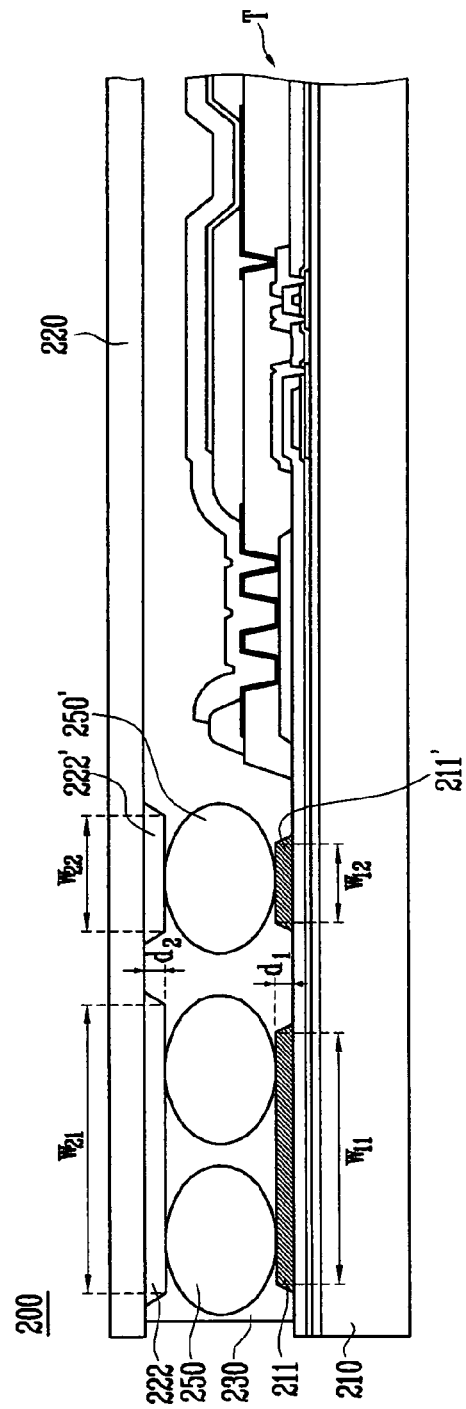

ORGANIC LIGHT EMITTING DISPLAY (OLED) WITH CONDUCTIVE SPACER AND ITS METHOD OF MANUFACTURE

CLAIM OF PRIORITY

This application makes reference to, incorporates the same herein, and claims all benefits accruing under 35 U.S.C. §119 from an application for ORGANIC LIGHT EMITTING DISPLAY WITH CONDUCTIVE SPACER AND THE PRODUCING METHOD THEREOF earlier filed in the Korean Intellectual Property Office on the 30 Sep. 2005 and there duly assigned Serial No. 10-2005-0092312.

BACKGROUND OF THE INVENTION

1. Field of the Invention

The present invention relates to an Organic Light Emitting Display (OLED) with a conductive spacer and its method of manufacture, and more specifically to an OLED with a conductive spacer having power supply stripes respectively formed on an upper and lower substrates being electrically connected to each other by the conductive spacer arranged therebetween.

2. Description of Related Art

Organic Light Emitting Displays (OLEDs) are emissive displays which electrically excite a compound material having a phosphorescence or fluorescence optical property and thereby emits visible light and have been considered to be the next generation display because they can solve the problems concerned with existing Liquid Crystal Displays (LCDs), especially in that OLEDs can be driven with a low voltage, can be easily thin-filmed, have a good viewing-angle range and have a fast response speed, etc.

When an anode and cathode of the OLED are respectively supplied with positive voltages and negative voltages, the holes injected from the anode move into an organic Emitting Film Layer (EML) via a Hole Transport Layer (HTL), whereas the electrons injected from the cathode move into the EML via an Electron Transport Layer (ETL). Then, within the EML, the electrons and the holes are recombined to produce the excitons which in turn make a transition from an excitation state to a base band state, resulting in emitting light to form an image.

In the view of the manufacturing quality of OLED, it is very important to reduce the area of "dead space", namely, to reduce a non-emissive region in which light emission does not occur, thereby resulting in compact OLEDs. Contrary to the case of the LCD where each pixel need not be supplied with a respective voltage, each pixel must be supplied with the same respective voltage in the case of OLED, especially active matrix OLEDs, thus requiring relatively wider power supply lines to be arranged in the outer region of the active area, namely, the emissive regions, to reduce the voltage drop (I-R drop).

An OLED includes an inner region, representing the emissive region and an outer region excluding the inner region, representing the non-emissive region, in other words, dead space. The power supply stripe is located within the outer region.

The OLED is formed of the combination of an upper substrate and a lower substrate having a thin film transistor. During the combination step, the power supply stripe is formed on the lower substrate in the non-emissive region and then sealed by a sealing portion.

In driving the OLED, the area of the stripe required to maintain the amount of stripe material and length of the stripe for constantly supplying the power within the tolerable voltage drop range is constant. Consequently, if the width of the stripe is reduced to diminish the non-emissive region, then the thickness of the stripe must increase according. In other words, in order to supply the same amount of current when the width of the stripe is reduced and thus the area of the non-emissive region is diminished, the thickness of the stripe must increase.

In order to reduce the non-emissive region of the OLED discussed above, an increase in the thickness of the stripe is needed due to the reduction of the width of the stripe. However, to produce such a construction, the manufacturing process of the OLED is more complicated because the steps of thickly depositing the stripe and partially etching the thickly deposited layer are involved in the process.

SUMMARY OF THE INVENTION

The present invention is directed to overcoming the above-mentioned problems which have been experienced from other OLEDs.

That is, the present invention has an object of providing an Organic Light Emitting Display (OLED) with a conductive spacer to permit arranging the power supply stripe layout efficiently and to reduce the area of "dead space" and thus increase the active region, thereby resulting in very compact OLEDs, and providing a method of manufacturing such an OLED with a conductive spacer.

For achieving the above objects, an Organic Light Emitting Display (OLED) is provided including: a lower substrate having at least one thin film transistor arranged thereon in an active region and a power supply lower stripe arranged thereon in a non-emissive region; an upper substrate corresponding to the lower substrate and having a power supply upper stripe arranged thereon in the non-emissive region; and a conductive spacer arranged between the upper stripe and the lower stripe in the non-emissive region to electrically connect the upper stripe to the lower stripe.

The conductive spacer preferably includes an element having a spherical portion. The spherical conductive spacer preferably includes an elastic material. The elastic spherical conductive spacer preferably has an inner portion including a polymer resin. The elastic spherical conductive spacer preferably has an inner portion including a cavity. The elastic spherical conductive spacer preferably has an outer portion including a conductive metal layer enclosing the polymer resin. The conductive metal layer preferably includes any one of Ni, Au and Ni/Au.

The polymer resin layer is preferably 0.1 micrometer thick and the outer conductive metal layer enclosing the polymer resin is preferably 0.05 micrometer thick.

The spherical conductive spacer preferably includes a metal in its entirety. The metal preferably includes Ni or solder. The spherical conductive portion preferably includes a carbon fiber. The diameter of the spherical portion is preferably in a range of from 3 to 15 micrometer large.

The OLED preferably further includes a sealing portion arranged between mutually facing surfaces of the upper substrate and the lower substrate with the conductive spacer being arranged therebetween. The portion percentage of the spacer to said sealing portion is preferably in a range of between 1 to 7%.

The upper and lower stripes arranged on the upper and lower substrates are preferably respectively different from each other in terms of widths of the stripes. A width $W_2$ of the upper stripe arranged on the upper substrate is preferably greater than a width $W_1$ of the lower stripe arranged on the lower substrate.

The OLED preferably further includes an upper auxiliary stripe arranged on the upper substrate and a lower auxiliary stripe arranged on the lower substrate.

For also achieving the above objects, a method of manufacturing an Organic Light Emitting Display (OLED) is provided, the method including: respectively forming power supply upper and lower stripes on upper and lower substrates; and forming a conductive spacer arranged between the upper and lower stripes to space apart the upper and lower substrates and to electrically connect the upper stripe to the lower stripe.

The method further preferably includes: pressing and compacting the upper and lower substrates toward each other after forming the spacer therebetween; and heating the upper and lower substrates.

BRIEF DESCRIPTION OF THE DRAWINGS

A more complete appreciation of the present invention, and many of the attendant advantages thereof, will be readily apparent as the present invention becomes better understood by reference to the following detailed description when considered in conjunction with the accompanying drawings in which like reference symbols indicate the same or similar components, wherein:

FIG. 4C is a cross-sectional view of one portion of an OLED having a conductive spacer according to yet another embodiment of the present invention.

FIG. 4D is a cross-sectional view of one portion of an OLED having a conductive spacer according to still another embodiment of the present invention.

DETAILED DESCRIPTION OF THE INVENTION

Figure 1:
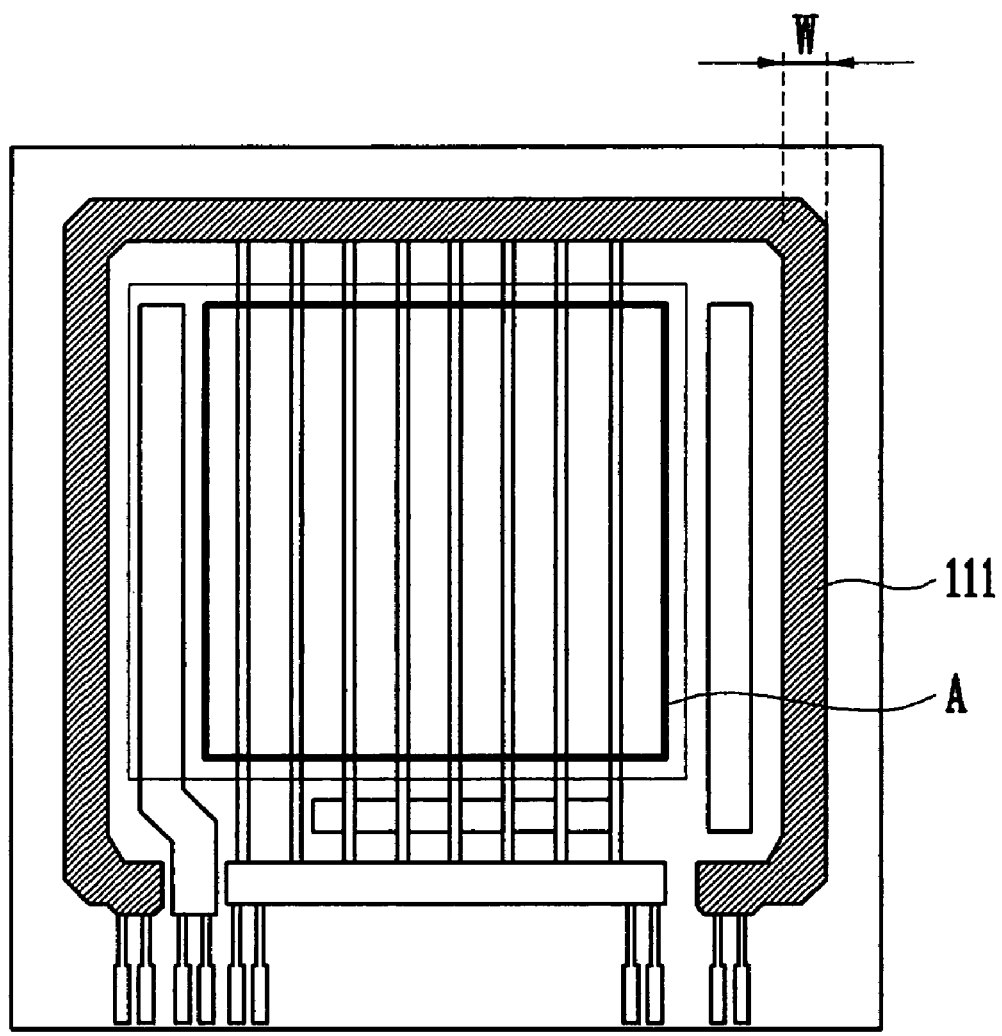
FIG. 1 is a power supply layout of an Organic Light Emitting Display (OLED).

FIG. 1 is a power supply layout of an Organic Light Emitting Display (OLED). The OLED 100 includes an inner region A, representing the emissive region and an outer region excluding the inner region, representing the non-emissive region, in other words, dead space. The power supply stripe 111 is located within the outer region.

Figure 2:
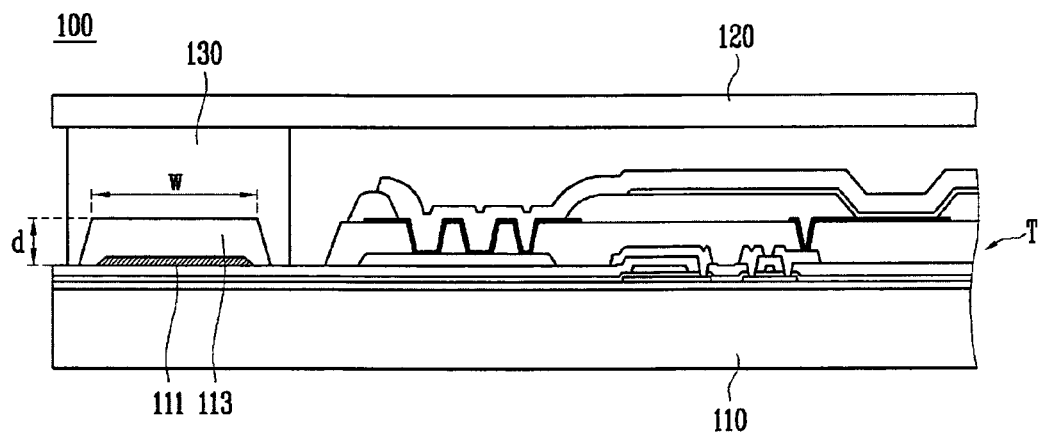
FIG. 2 is a cross-sectional view of one portion of an OLED.

FIG. 2 is a cross-sectional view of one portion of an OLED. The OLED 100 is formed of the combination of an upper substrate 120 and a lower substrate 110 having a thin film transistor T. During the combination step, the power supply stripe 111 is formed on the lower substrate 110 in the non-emissive region and then sealed by a sealing portion 130. Detailed descriptions of a passivation layer 113 and the thin film transistor T have been omitted.

The area dimensions of the non-emissive region having the power supply stripe 111 therein are defined by Equation (1) below:

$$DS = L \times W \quad (1)$$

DS, L and W respectively represent the area of the non-emissive region, the length of the power supply stripe and width of the power supply stripe.

Furthermore, the cross-sectional area of the stripe 111 is defined by Equation (2) below:

$$A = W \times d \quad (2)$$

A and d respectively represent the cross-sectional area and thickness of the stripe 111.

In driving the OLED, the area of the stripe 111 required to maintain the amount of stripe material and length of the stripe for constantly supplying the power within the tolerable voltage drop range is constant. Consequently, if the width W of the stripe 111 is reduced to diminish the non-emissive region, then the thickness d of the stripe 111 must increase according to Equation (2). In other words, in order to supply the same amount of current when the width of the stripe is reduced and thus the area of the non-emissive region is diminished, the thickness d of the stripe 111 must increase.

Figure 3:
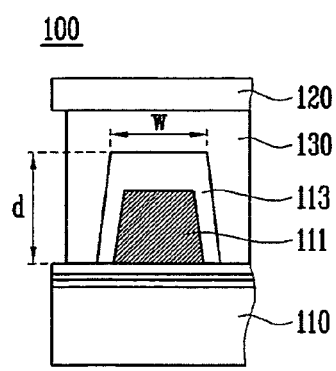
FIG. 3 is a cross-sectional view of one portion of another OLED.

FIG. 3 is a cross-sectional view of one portion of another OLED. As shown in FIG. 3, in order to reduce the non-emissive region of the OLED of FIG. 2, an increase in the thickness d of the stripe 111 is needed due to the reduction of the width W of the stripe 111. However, to produce such a construction, the manufacturing process of the OLED is more complicated because the steps of thickly depositing the stripe 111 and partially etching the thickly deposited layer are involved in the process.

A detailed description of exemplary embodiments of an OLED having a conductive spacer according to the present invention follows with reference to the accompanying drawings.

Figure 4A:
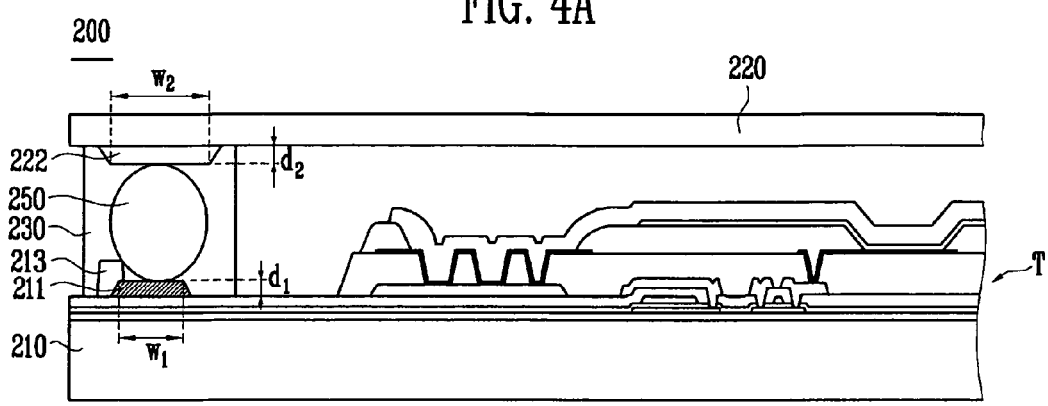
FIG. 4A is a cross-sectional view of one portion of an OLED having a conductive spacer according to one embodiment of the present invention.

FIG. 4A is a cross-sectional view of one portion of an OLED having a conductive spacer according to one embodiment of the present invention.

The OLED 200 having the conductive spacer according to one embodiment of the present invention includes a lower substrate 210 having at least one thin film transistor T formed thereon in an active region and a power supply lower stripe 211 formed thereon in a non-emissive region, an upper substrate 220 corresponding to the lower substrate 210 and having a power supply upper stripe 222 formed thereon in the non-emissive region, and a conductive spacer 250 disposed between the upper stripe 222 and the lower stripe 211 in the non-emissive region to electrically connect the upper stripe 222 to the lower stripe 211.

A thin film transistor T is formed on the lower substrate 210 of the OLED 200 having the conductive spacer 250. In addition, the power supply lower stripe 211 is formed on the lower substrate 210 in the non-emissive region. The power supply upper stripe 222 is formed on the upper substrate 220 corresponding to the lower stripe 211 formed on the lower substrate 210. It should be noted that the upper substrate 220 could be an encapsulation glass substrate. The respective thickness and width of the lower stripe 211 are $d_1$ and $W_1$ and the respectively thickness and width of the upper stripe 222 are $d_2$ and $W_2$. The layer indicated as reference numeral 113 is a passivation layer.

The above resultant lower and upper substrates 210 and 220 are joined together. A sealing portion 230 is formed between the upper and lower substrate.

The sealing portion 230 is formed between the mutually facing surfaces of the upper substrate and the lower substrate in the combination of the both substrates with the conductive spacer arranged therebetween so that the conductive spacer electrically connects the upper stripe to the lower stripe to supply the each stripe with electrical power. It is important to note that in the OLED of FIG. 3, only the lower stripe 111 supplies power to the OLED, whereas in the OLED according to an embodiment of the present invention of FIG. 4, both the lower stripe 211 and the upper stripe 222 supply power to the OLED. Accordingly, in the OLED of FIG. 3, the total cross-sectional area of the power supply stripe is defined by multiplying the thickness d of the lower stripe 111 by the width W of the lower stripe 111, whereas the total cross-sectional area of the power supply stripe in the OLED of FIG. 4A is defined by the sum of the cross-sectional areas $A_1$ and $A_2$ of the lower and upper stripes 211 and 222.

In other expression, the cross-sectional areas $A_1$ and $A_2$ of the lower and upper stripes 211 and 222 are defined by Equations (3) below:

$$A_1 = d_1 \times W_1$$

$$A_2 = d_2 \times W_2 \qquad (3)$$

wherein, $A_1$ and $A_2$ respectively represent the cross-sectional areas of the lower and upper stripes 211 and 222, $d_1$ and $d_2$ respectively represent the thickness of the lower and upper stripes 211 and 222, and the $W_1$ and $W_2$ respectively represent the width of the lower and upper stripes 211 and 222.

The total cross-sectional area A of the power supply stripes of the OLED is defined by Equation (4) below:

$$A = A_1 + A_2 \qquad (4)$$

According to Equations (3) and (4), by separately arranging the upper and lower stripes 222 and 211, the total cross-sectional area A of the power supply stripes of the OLED could be divided into the cross-sectional area $A_1$ of the lower stripe 211 and the cross-sectional area $A_2$ of the upper stripe 222. Consequently, in the OLED of FIG. 3, in order to reduce the non-emissive region, if the width W of the power supply stripe could be decreased, there will be the need to increase the thickness of the power supply stripe, whereas in the present embodiment of FIG. 4A, by separately arranging the upper and lower stripes 222 and 211, the non-emissive region can be further diminished by reducing the widths $W_1$ and $W_2$ of the stripes 211 and 222 without increasing the thickness $d_1$ and $d_2$ of the stripes 211 and 222.

Figure 4B:
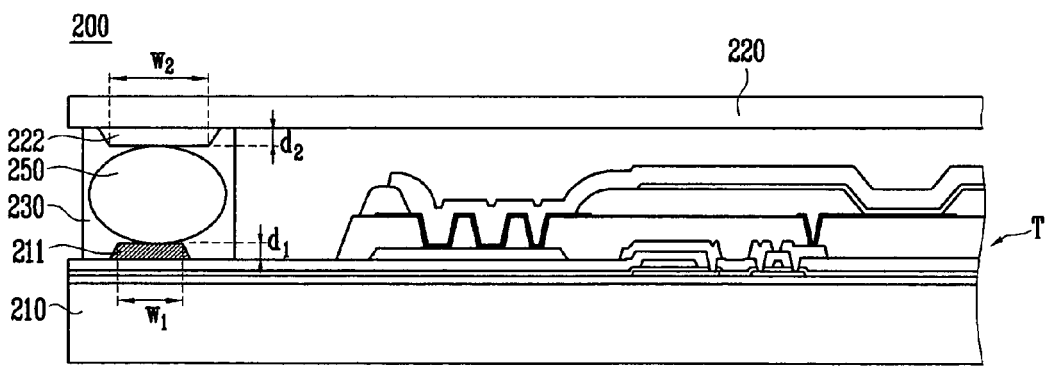
FIG. 4B is a cross-sectional view of one portion of an OLED having a conductive spacer according to another embodiment of the present invention.

FIG. 4B is a cross-sectional view of one portion of the OLED with a conductive spacer according to another embodiment of the present invention.

In this embodiment, the conductive spacer 250 is strongly pressed between the upper stripe 222 of the upper substrate 220 and the lower stripe 211 of the lower substrate 210 so that the contacting areas between the spacer 250 and the lower/upper stripes 211 and 222 are increased. That is to say, in this embodiment where the contacting areas between the spacer 250 and the lower/upper stripes 211 and 222 are increased, a greater amount of current can flow from the lower stripe 211 (anode) to the upper stripe 222 (cathode) due to the increased contact area between the spacer 250 and the lower/upper stripes 211 and 222.

In the present embodiment of FIG. 4B, the passivation layer which corresponds to the passivation layer 113 of FIG. 4A has not been drawn. It is noted that the passivation layer is not a necessity but an option not only in the embodiment of FIG. 4A but also in other embodiments discussed in the present specification.

FIG. 4C is a cross-sectional view of one portion of the OLED with a conductive spacer according to another embodiment of the present invention.

In the OLED with the conductive spacer according to another embodiment of the present invention, the upper and lower stripes 211 and 222 are different from each other in terms of their width. In FIG. 4C, the width $W_1$ of the stripe 211 is more small than the width $W_2$ of the stripe 222. Furthermore, there are a plurality of the conductive spacers pressed between both stripes as the upper and lower stripes are wider than those of the other FIGS. In this embodiment, the further increased cross-sectional area A of the power supply stripes could be obtained with the more increased width $W_2$ of the upper stripe 222, and thus, a greater amount of current flows from the lower stripe 211 (anode) to the upper stripe 222 (cathode).

FIG. 4D is a cross-sectional view of one portion of the OLED with a conductive spacer according to still another embodiment of the present invention.

In the OLED with the conductive spacer according to still another embodiment of the present invention, an upper auxiliary stripe 222' is formed in the outer region of the upper stripe 222 on the upper substrate 220, and a lower auxiliary stripe 211' is formed in the outer region of the lower stripe 211 on the lower substrate 210. The upper and lower auxiliary stripes 211' and 222' function for the specific purpose and otherwise provide the OLED with larger path through which the current can flow. In other words, it is possible to establish the increased cross-sectional area of the stripes using the widths $W_{11}$ and $W_{22}$ of the upper and lower auxiliary stripes 211' and 222' in a way different from the way which was implemented in the embodiment of FIG. 4C to effect the same result.

Figure 5:
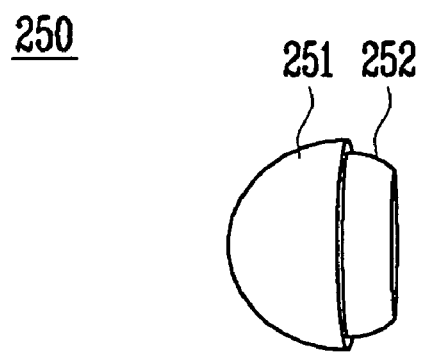
FIG. 5 is a cross-sectional view of a conductive spacer of an OLED having a conductive spacer according to one embodiment of the present invention.

FIG. 5 is a cross-sectional view of a conductive spacer according to an embodiment of the present invention.

Referring to FIG. 5, the conductive spacer 250 is electrically conductive so as to electrically connect the upper and lower stripes 211 and 222. To this end, the spacer 250 is electrically conductive throughout its entire volume or partially on its outer surface.

Preferably, the spacer 250 is an elastic spherical element. This is because of the fact that when the spacer 250 is pressed between the both stripes as shown in the FIG. 4B, the contacting force between the spacer and the stripes gets higher due to the elastic restoring force of the elastic spacer after the pressure has been applied and the size of contacting area between the spacer and the stripes gets larger due to the spherical shape of the spacer and, if not spherical shape but rather any other shape, the size of the contacting area never gets as large. Specifically, when using a conductive spacer having a rectangular or cylindrical shape, it is more likely that the spacer will expand and protrude in the direction of shearing force after the pressure has been applied, thereby leading to the degradation of the contacting force between the spacer and the stripes. This is why the spacer preferably has a spherical shape.

An elastic spherical conductive spacer 250 has an inner side 252 consisting of a polymer resin, an inner part forming a cavity 253 and an outer side 251 consisting of the conductive metal layer enclosing the polymer resin. In this way, the elasticity of spacer 250 is generated by the polymer resin. The conductive metal layer enclosing the polymer resin includes any one of Ni, Au and Ni/Au.

As one example of the conductive spacer 250 with such configuration, the polymer resin layer is 0.1 micrometer thick and the outer conductive metal layer enclosing the polymer resin is 0.05 micrometer thick.

Alternatively or additionally, the elastic spherical conductive spacer 250 consists of a metal, such as Ni or solder, or consists of a carbon fiber. When the spacer is in the form of such a metal ball not having elasticity, the conductive spacer undergoes a plastic transformation when it is pressed. The diameter of the spherical spacer is from 3 to 15 micrometers and the portion percentage of the spacer to the sealing portion 230 is in a range of between 1 to 7%.

A detailed description of a method of fabricating an OLED having a conductive spacer according to an embodiment of the present invention follows, referring to the accompanying drawing.

Figure 6:
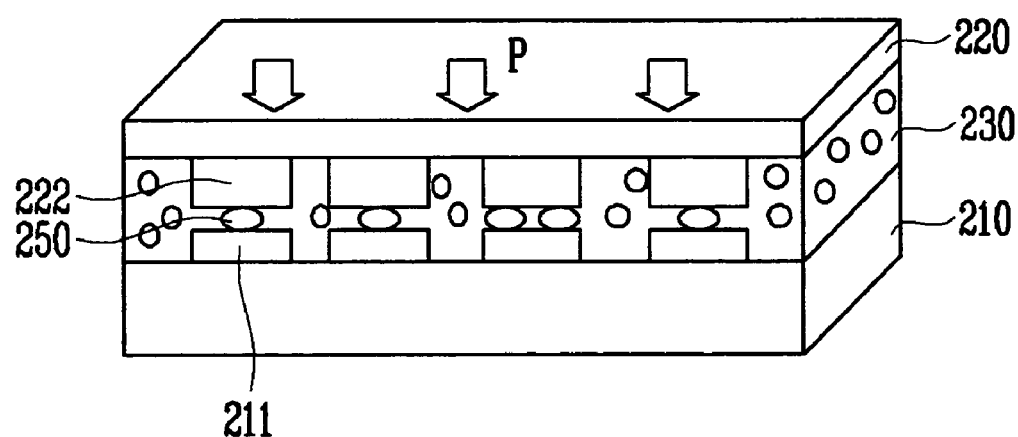
FIG. 6 is a cross-sectional view of a method of manufacturing an OLED having a conductive spacer according to one embodiment of the present invention.

FIG. 6 is a cross-sectional view of a method of manufacturing an OLED having a conductive spacer according to an embodiment of the present invention.

The method of manufacturing an OLED with a conductive spacer according to an embodiment of the present invention includes the steps of respectively forming the power supply upper and lower stripes 222 and 211 on the upper and lower substrates 220 and 210 and forming the conductive spacer 250 electrically connecting the upper and lower stripes 222 and 211 together.

On the lower substrate 210 having at least one thin film transistor T (not shown in FIG. 6) formed thereon in an active region, a power supply lower stripe 211 can be formed in a non-emissive region. On the upper substrate 220, a power supply upper stripe 222 can be formed corresponding to the lower substrate 210. In this example, each of the width $W_2$ of the upper stripe 222 formed on the upper substrate 220 and the width $W_1$ of the lower stripe 211 formed on the lower substrate 210 is greater than the width W of the lower stripe 211 as shown in FIG. 3. That is, an OLED having a conductive spacer according to an embodiment of the present invention could have an active area that is larger than that of the OLED of FIG. 3 and could have an inactive area that is smaller than that of the OLED of FIG. 3.

Then, the conductive spacer 250 can be disposed between the upper stripe 222 and the lower stripe 211 in the non-emissive region. Thus, the spacer 250 electrically connects the upper stripe 222 and the lower stripe 211 together and to this end can be electrically conductive. The spacer 250 can be formed on the upper and lower stripes 222 and 211 or on the sealing portion 230.

Thereafter, the upper and lower substrates 210 and 220 can be combined with the sealing portion 230. It is preferable that such a combination occurs with the step of pressing and compacting P the upper and lower substrates toward each other substrate. As a result, the contacting areas between the spacer 250 and the stripes 211 and 222 gets larger.

Succeedingly and more preferably, the combination step includes heating the combined portion of the upper and lower substrate 210 and 220. With such a heating treatment, the elastic polymer resin of the spacer 250 will possess a higher level of viscosity. If the above pressing and compacting step occurs with the polymer resin having an increased viscosity level, both the contacting area size and force level between the spacer 250 and the upper/lower stripes 211 and 222 get increased.

While this invention has been particularly shown and described with reference to exemplary embodiments thereof, it will be understood by those skilled in the art that various modifications in form and detail can be made therein without departing from the scope of the present invention encompassed by the appended claims.

As mentioned above, an OLED with a conductive spacer according to the present invention and the method thereof permits arranging the power supply stripe layout efficiently and reduces the area of "dead space" and thus increases the active region, thereby forming very compact OLED devices.

In the drawings and specification, exemplary embodiments of the present invention have been disclosed and, although specific terms have been employed, they are used in a generic and descriptive sense only and not for purposes of limitation, the scope of the present invention being defined by the following claims.

What is claimed is:

1. An Organic Light Emitting Display (OLED), comprising:
   a lower substrate having at least one thin film transistor arranged thereon in an active region and a single power supply lower stripe arranged thereon in a non-emissive region;
   an upper substrate corresponding to the lower substrate and having a single power supply upper stripe arranged thereon in the non-emissive region; and
   a plurality of elastic spherical conductive spacers arranged between the upper stripe and the lower stripe in the non-emissive region to electrically connect the upper stripe to the lower stripe,
   wherein said power supply upper stripe is an anode and said power supply lower stripe is a cathode,
   wherein a width of said power supply upper stripe is greater than a width of said power supply lower stripe.

2. The OLED of claim 1, wherein the plurality of elastic spherical conductive spacers each have an inner portion comprising a polymer resin.

3. The OLED of claim 2, wherein the plurality of elastic spherical conductive spacers each have an inner portion comprising a cavity.

4. The OLED of claim 3, wherein the plurality of elastic spherical conductive spacers each have an outer portion comprising a conductive metal layer enclosing the polymer resin.

5. The OLED of claim 4, wherein the conductive metal layer comprises any one of Ni, Au and Ni/Au.

6. The OLED of claim 5, wherein the polymer resin layer is 0.1 micrometer thick and the outer conductive metal layer enclosing the polymer resin is 0.05 micrometer thick.

7. The OLED of claim 1, wherein the spherical conductive spacer comprises a metal in its entirety.

8. The OLED of claim 7, wherein the metal comprises Ni or solder.

9. The OLED of claim 1, wherein the spherical conductive spacers comprises a carbon fiber.

10. The OLED of claim 1, wherein the diameter of the spherical portion of the plurality of elastic spherical conductive spacers is in a range of from 3 to 15 micrometer large.

11. The OLED of claim 1, further comprising a sealing portion arranged between mutually facing surfaces of the upper substrate and the lower substrate with the plurality of elastic spherical conductive spacers being arranged therebetween.

12. The OLED of claim 11, wherein the portion percentage of each of the plurality of elastic spherical conductive spacers to said sealing portion is in a range of between 1 to 7%.

13. The OLED of claim 1, further comprising an upper auxiliary stripe arranged on the upper substrate and a lower auxiliary stripe arranged on the lower substrate.

14. An Organic Light Emitting Display (OLED), comprising:
   a lower substrate having at least one thin film transistor arranged thereon in an active region and a single power supply lower stripe arranged thereon in a non-emissive region;

an upper substrate corresponding to the lower substrate and having a single power supply upper stripe arranged thereon in the non-emissive region; and a plurality of spherical elastic conductive spacers arranged between the power supply upper stripe and the power supply lower stripe in the non-emissive region to electrically connect the power supply upper stripe to the power supply lower stripe.

* * * * *